(12) United States Patent
Cho et al.

(10) Patent No.: US 7,977,128 B2
(45) Date of Patent: Jul. 12, 2011

(54) ETCHANT FOR ETCHING DOUBLE-LAYERED COPPER STRUCTURE AND METHOD OF FORMING ARRAY SUBSTRATE HAVING DOUBLE-LAYERED COPPER STRUCTURES

(75) Inventors: Won-Ho Cho, Gyeongsangbuk-do (KR); Gyoo-Chul Jo, Gyeonggi-do (KR); Gue-Tai Lee, Gyeongsangbuk-do (KR); Jin-Gyu Kang, Incheon (KR); Beung-Hwa Jeong, Gyeongsangbuk-do (KR); Jin-Young Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/718,724

(22) Filed: Mar. 5, 2010

(65) Prior Publication Data

US 2010/0159624 A1 Jun. 24, 2010

Related U.S. Application Data

(62) Division of application No. 10/867,007, filed on Jun. 15, 2004.

(30) Foreign Application Priority Data

Jun. 24, 2003 (KR) .............................. 2003-0041162

(51) Int. Cl.
*H01L 21/84* (2006.01)

(52) U.S. Cl. ................... 438/30; 438/158; 257/E21.561
(58) Field of Classification Search .................. 438/30, 438/151–166; 257/E21.561
See application file for complete search history.

(56) References Cited

U.S. PATENT DOCUMENTS

| | | | |
|---|---|---|---|
| 4,140,772 A * | 2/1979 | Korenowski .................. 423/272 |
| 4,459,216 A | 7/1984 | Nakazato et al. |
| 5,700,389 A | 12/1997 | Nakagawa |
| 5,770,103 A | 6/1998 | Wang et al. |
| 5,954,997 A | 9/1999 | Kaufman et al. |
| 6,156,221 A | 12/2000 | Lauffer et al. |
| 6,653,224 B1 | 11/2003 | Gotkis et al. |
| 7,229,569 B1 * | 6/2007 | Seki et al. .................... 252/79.1 |
| 2003/0146512 A1 | 8/2003 | Yang et al. |

* cited by examiner

*Primary Examiner* — Richard A. Booth
(74) *Attorney, Agent, or Firm* — McKenna Long & Aldridge LLP

(57) ABSTRACT

An etchant for forming double-layered signal lines and electrodes of a liquid crystal display device includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer, wherein each of the double-layered signal lines and electrodes of the liquid crystal display device includes a first layer of one of aluminum (Al), aluminum alloy (Al-alloy), titanium (Ti), titanium alloy (Ti-alloy), tantalum (Ta), and a tantalum alloy (Ta-alloy) and a second layer of copper (Cu).

16 Claims, 11 Drawing Sheets

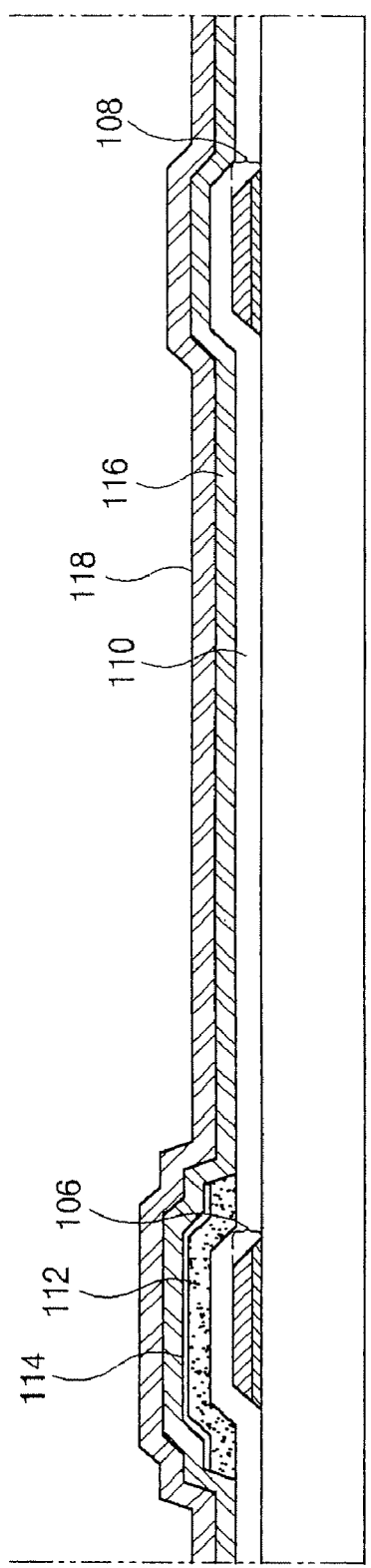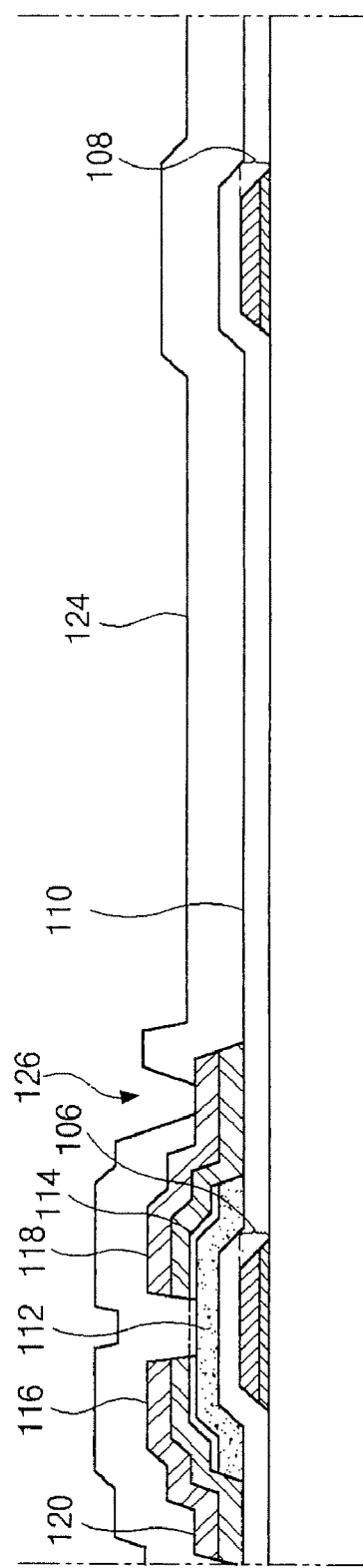

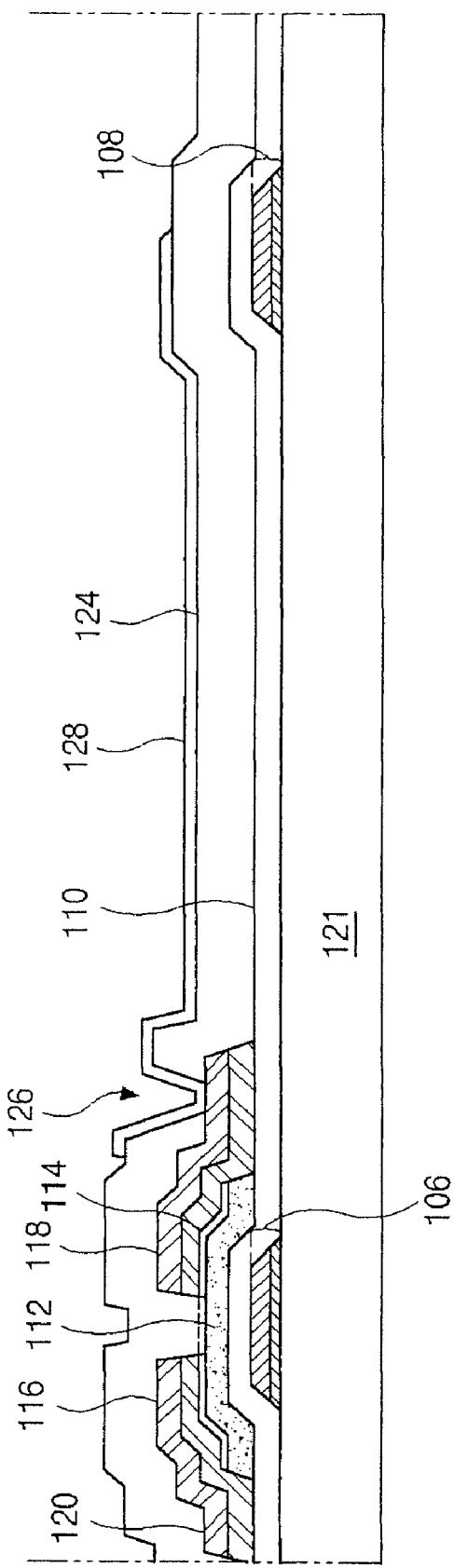

ETCHANT FOR ETCHING DOUBLE-LAYERED COPPER STRUCTURE AND METHOD OF FORMING ARRAY SUBSTRATE HAVING DOUBLE-LAYERED COPPER STRUCTURES

This application is a Divisional of application Ser. No. 10/867,007 filed Jun. 15, 2004, which claims priority to Korean Patent Application No. 10-2003-0041162 filed Jun. 24, 2003, all of which are hereby incorporated by reference for all purposes as if fully set forth herein.

BACKGROUND OF THE INVENTION

1. Field of the Invention

The present invention relates to an array substrate for electronic equipment, and more particularly, to an etchant and an etching method for liquid crystal display (LCD) devices.

2. Discussion of the Related Art

In general, metal lines in electronic equipment generally serve to apply signals to electronic elements. However, the metal lines contribute to production costs and stability of the electronic equipment. Accordingly, a material to form the metal lines needs to be inexpensive, have a low electrical resistance, and a high corrosion resistance.

Array substrates are commonly used in LCD devices, wherein performance characteristics and operational properties of the array substrates are partially determined by the material with which individual elements of the array substrates are formed. For example, gate and data lines of the array substrate significantly influence the performance characteristics and operational properties of the array substrate. Although the resistance of the materials used to form the gate and data lines is relatively insignificant in small-sized LCD devices, the resistance of the gate and data lines in large-sized LCD devices is directly dependent upon image quality. Thus, in large-sized LCD devices having high resolution, materials with which to form the gate and data lines includes aluminum (Al) or Al-alloys due to their low electrical resistance.

However, pure aluminum is chemically weak when exposed to acidic processing, and may result in formation of hillocks on surfaces of the gate line and gate electrode during high temperature processing. Furthermore, the occurrence of hillocks may cause extraordinary growth of a gate insulation layer subsequently formed on the gate line and gate electrode. Thus, the gate insulation layer may be destroyed, and an electrical short circuit may be created between the gate electrode and an active layer that is subsequently formed on the gate insulation layer. Accordingly, thin film transistors (TFTs) having gate lines and gate electrodes formed from pure aluminum do not adequately function as switching devices.

FIG. 1 is a perspective view of a transflective LCD device according to the related art. In FIG. 1, a transflective LCD device 11 includes upper and lower substrates G1 and G2 with an interposed liquid crystal layer 70. For example, the upper and lower substrates G1 and G2 are commonly referred to as color filter and array substrates, respectively.

On a surface of a substrate 5 facing the array substrate G2, the color filter substrate G1 sequentially includes a black matrix 6 and a color filter layer 7. The color filter layer 7 includes a matrix array of red (R), green (G), and blue (B) color filters, and the black matrix 6 is disposed among the matrix array of red (R), green (G), and blue (B) color filters, such that each color filter is divided by the black matrix. In addition, a common electrode 18 is disposed on both the color filter layer 7 and the black matrix 6.

On a surface of a substrate 21 facing the upper substrate G1, the array substrate G2 includes an array of TFTs T (in FIG. 2) that function as switching devices. The array of TFTs is formed to correspond to the matrix array of red (R), green (G) and blue (B) color filters, wherein a plurality of gate and data lines 33 and 53 are positioned to cross each other and the TFT T is located near the crossing portion of the gate and data lines 33 and 53. In addition, the lower substrate G2 includes a plurality of pixel regions P that are defined by the crossing of the gate and data lines 33 and 53, wherein a pixel electrode 69 is disposed within the pixel regions P.

FIG. 2 is an enlarged plan view of a portion "S" of FIG. 1 according to the related art. In FIG. 2, the TFT T includes a gate electrode 31, an active layer 39, a source electrode 49, and a drain electrode 51. The gate electrode 31 is elongated from the gate line 33, and the source electrode 49 is elongated from the data line 53. In addition, the active layer is disposed over the gate electrode 31 between the source and drain electrodes 49 and 51, and the drain electrode 51 is spaced apart from the source electrode 49 across the gate electrode 31.

In FIGS. 1 and 2, the common electrode 18 and the pixel electrode 69 are all formed of a transparent conductive material having good light transmissivity, such as indium tin oxide (ITO). The LCD device of FIGS. 1 and 2 utilizes optical anisotropy and polarization characteristics of liquid crystal molecules of the liquid crystal layer 70 to create images, wherein the liquid crystal molecules have specific alignment directions due to their inherent physical properties. Accordingly, since incident light may be refracted by the alignment of the liquid crystal molecules to form the images and the specific alignment directions of the liquid crystal molecules may be modified by application of an electric field, creation of the images may be easily controlled by changing the electric field. In addition, the material for forming the gate and data lines 33 and 53 is significantly important. For example, if the gate and data lines 33 and 53 are formed of a metallic material having a high electrical resistance, signal delays may be generated along the gate and data lines 33 and 53, thereby misaligning the liquid crystal molecules and preventing the images from properly being created. Thus, image resolution of the LCD device may be reduced.

FIG. 3 is a cross sectional view along III-III of FIG. 1 according to the related art. In FIG. 3, a switching region T and a pixel region P are defined on a substrate 21 by the gate electrode 31 and the gate line 33 formed on the substrate 21. For example, the gate line 33 is disposed along a first direction adjacent to the pixel region P, and the gate electrode 31 extends from the gate line 33 into the switching region T. Then, a gate insulating layer 36 is formed on the substrate 21 to cover the gate electrode 31 and the gate line 33, and an active layer 39 of amorphous silicon and an ohmic contact layer 41 of doped amorphous silicon are sequentially formed on the gate insulating layer 36, especially over the gate electrode 31. Next, the source and drain electrodes 49 and 51 are disposed on the ohmic contact layer 41 and spaced apart from each other across the gate electrode 31. Accordingly, the data line 53 is connected to the source electrode 49 and extends on the gate insulating layer 36, and the data line 53 crosses the gate line 33 and defines the pixel region P (in FIG. 1). Next, a portion of the ohmic contact layer 41 between the source and drain electrodes 49 and 51 is eliminated to expose the underlying active layer 39. A passivation layer 59 is formed on the gate insulating layer 36 to cover the source electrode 49, the drain electrode 51, and the data line 53. In addition, the passivation layer 59 has a drain contact hole 61 that exposes a portion of the drain electrode 51. Then, the pixel electrode 69 of a transparent conductive material is formed on the passivation layer 59 within the pixel region P, and contacts the drain electrode 51 through the drain contact hole 61.

In FIG. 3, the gate electrode 31 and the gate line 33 are formed of aluminum (Al) or an aluminum alloy, such as AlNd. However, as previously described, aluminum is chemically weak and causes formation of hillocks. In order to overcome those disadvantages of using aluminum, chromium (Cr) or molybdenum (Mo), each of which has a strong chemical properties in acidic processes, is frequently used for the gate and data lines. However, forming the gate electrode 31 and the gate line 33 of Cr or Mo causes signal delays due to their high electrical resistance. Furthermore, if a double-layered structure of Al and Cr/Mo is used to form the gate and data lines 33 and 53, an etchant for simultaneously etching the double-layered structure is required and a process for etching the double-layered structure must be adjusted. In addition, if a double-layered structure of Al and Cr/Mo is used to form the gate and data lines 33 and 53, and if the Al layer and the Cr/Mo layer are separately etched, two separate process steps are necessary to etch the double-layered structure of Al and Cr/Mo, thereby complicating fabrication processes and decreasing manufacturing yield.

SUMMARY OF THE INVENTION

Accordingly, the present invention is directed to an etchant for etching a double-layered copper structure and a method of forming an array substrate having double-layered copper structures that substantially obviates one or more of the problems due to limitations and disadvantages of the related art.

An object of the present invention is to provide an etchant that simultaneously etches double-layered metal layer structures.

Another object of the present invention is to provide a method of forming an array substrate having copper lines and electrodes.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an etchant for forming double-layered signal lines and electrodes of a liquid crystal display device includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer, wherein each of the double-layered signal lines and electrodes of the liquid crystal display device includes a first layer of one of aluminum (Al), aluminum alloy (Al-alloy), titanium (Ti), titanium alloy (Ti-alloy), tantalum (Ta), and a tantalum alloy (Ta-alloy) and a second layer of copper (Cu).

In another aspect, a method of forming an array substrate of a liquid crystal display device includes forming a first metallic layer on a substrate, forming a first copper (Cu) layer on the first metallic layer, patterning the first metallic layer and the first Cu layer simultaneously using a first etchant to form a gate line and a gate electrode, the first etchant includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer, forming a gate insulating layer over an entire surface of the substrate to cover the gate line and the gate electrode, forming an active layer and an ohmic contact layer on the gate insulating layer and over the gate electrode, forming a second metallic layer and a second copper (Cu) layer over the gate insulating layer to cover the active layer and the ohmic contact layer, patterning the second metallic layer and the second Cu layer simultaneously using a second etchant to form a source electrode, a drain electrode, and a data line, the second etchant includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer, forming a passivation layer over the gate insulating layer to cover the source and drain electrodes and the data line, the passivation layer having a drain contact hole exposing a portion of the data line, and forming a pixel electrode on the passivation layer, the pixel electrode contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate the present invention and together with the description serve to explain the principles of that invention. In the drawings:

FIGS. 11A to 11E are cross sectional views of an exemplary method of fabricating of an array substrate according to the present invention.

DETAILED DESCRIPTION OF THE PREFERRED EMBODIMENTS

Reference will now be made in detail to the preferred embodiments of the present invention, examples of which are illustrated in the accompanying drawings.

According to the present invention, an etchant may be provided for etching copper-aluminum (Cu—Al), copper-titanium (Cu—Ti), or copper-tantalum (Cu—Ta) double layer structures, or multiple layers thereof. The etchant may include hydrogen peroxide ($H_2O_2$), phosphoric acid (or phosphate), and F-ion (e.g., ammonium bifluoride ($NH_4HF_2$)), 0.01-5%). Furthermore, the etchant may include hydrogen peroxides ($H_2O_2$), phosphoric acids (or phosphate), organic acid having carboxyl groups (—COOH), copper (Cu) inhibitors, $H_2O_2$ stabilizers, and additives. The additives included in the etchant may function to improve etching characteristics, such as etching time and etching efficiency.

The phosphates included in the etchant may be represented by a chemical formula of $A_xH_yPO_4$, wherein "A" may be an alkali metal, such as potassium (K) or sodium (Na), or may be an alkaline earth metal, such as calcium (Ca) or barium (Ba), or may be ammonium ($NH_4$), or may be ammonium derivatives, "X" may have a value of about 1 to about 2, and "Y" may have a value of about 0 to about 2. Furthermore, the F-ion contained in the etchant may be hydrofluoric acid (HF), ammonium fluoride ($NH_4F$), potassium fluoride (KF), sodium fluoride (NaF), or ammonium hydrogen fluoride ($NH_4HF$).

The organic acid may be acetic acid ($CH_3COOH$), formic acid (HCOOH), oxalic acid ($(COOH)_2$), citric acid ($C_6H_8O_7$), or glycolic acid ($HOCH_2COOH$). Accordingly, the organic acid may determine a hydrogenion concentration (pH) of the etchant to control the etch ratio of the etchant.

The Cu etch inhibitor may be an azole compound, such as methylimidazole ($C_4H_6N_2$) and pyrazole ($NHNH_2$), or may be a triazole compound, such as tolytriazole ($CH_3N_3$) and benzotriazole ($C_6H_5N_3$). Accordingly, the Cu etch inhibitor may prevent the etchant having the extracted copper ions ($Cu^{2+}$) from etching out the copper layer, thereby restraining an increase of a copper etching ratio.

The $H_2O_2$ stabilizer may be an acetate, such as ammonium acetate ($CH_3COONH_4$), potassium acetate ($CH_3COOK$), or sodium acetate ($CH_3COONa$).

Figure 1:
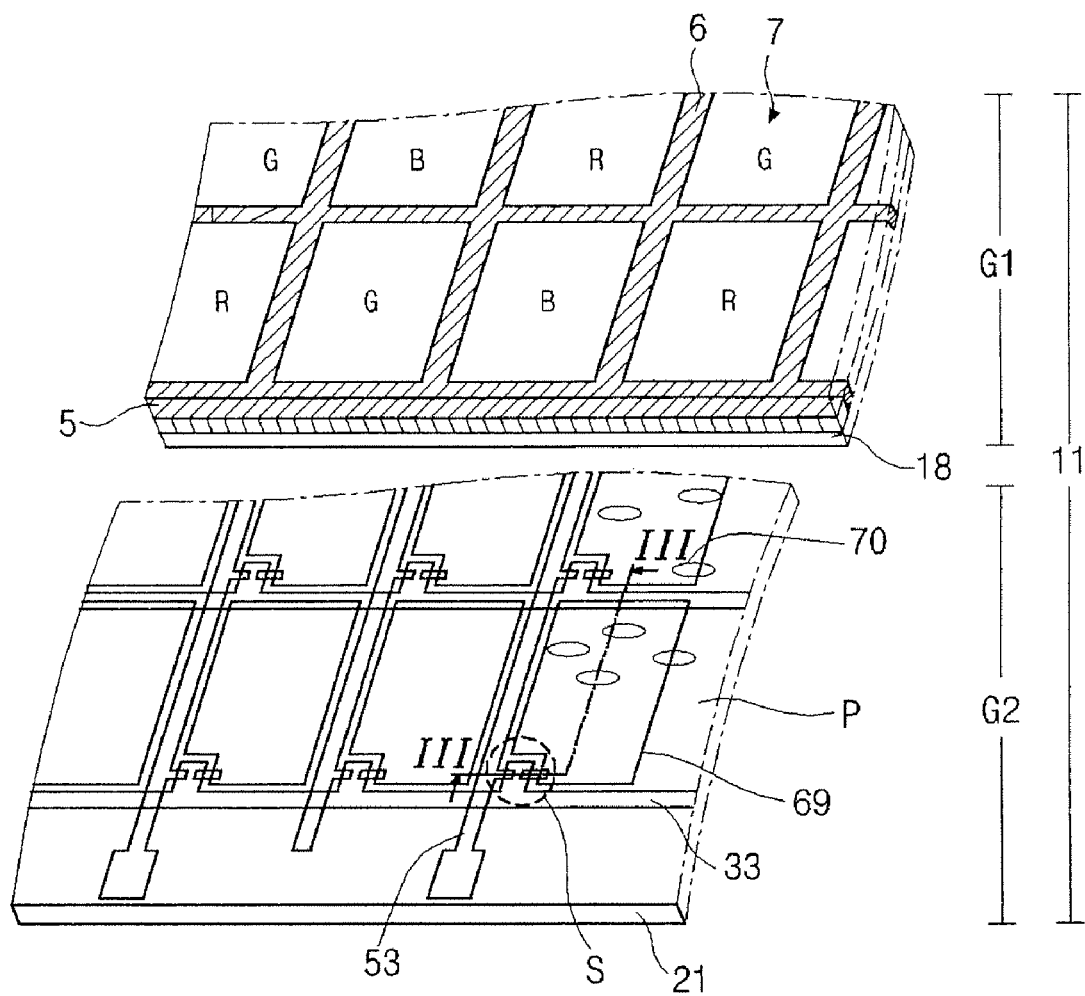
FIG. 1 is a perspective view of a transflective LCD device according to the related art.
Figure 2:
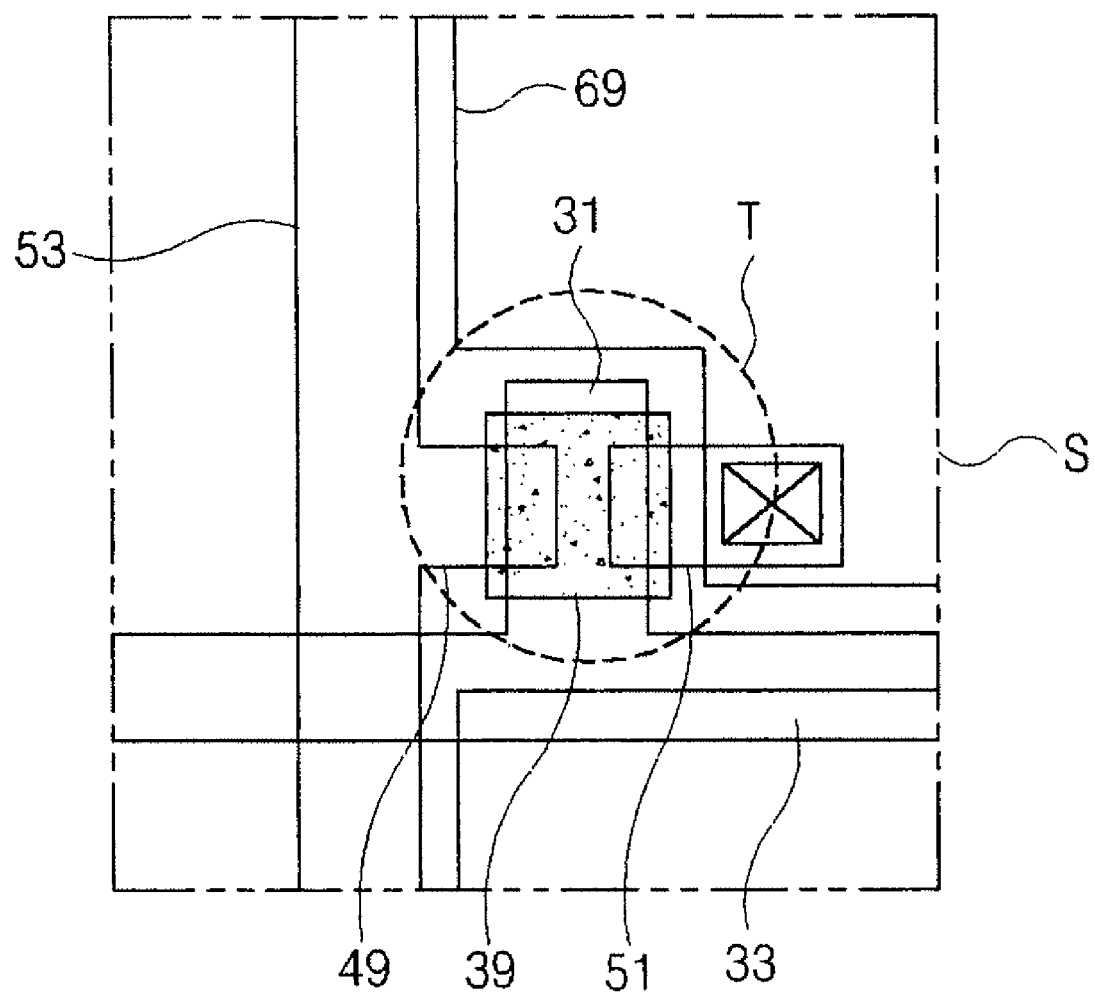
FIG. 2 is an enlarged plan view of a portion "S" of FIG. 1 according to the related art.
Figure 3:
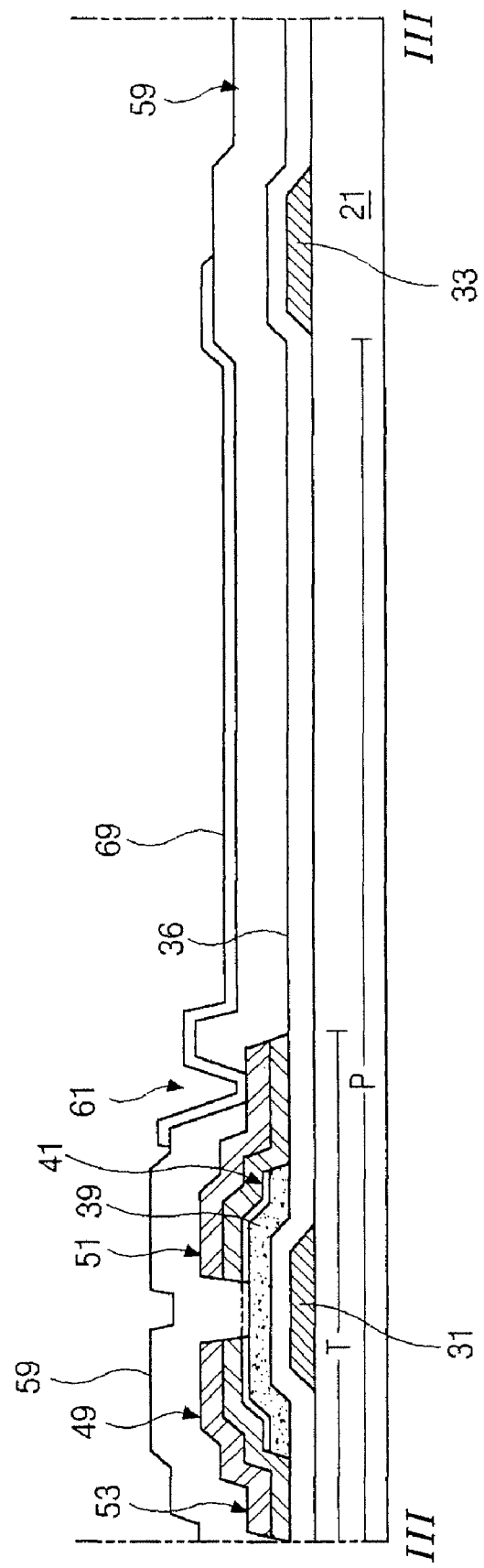
FIG. 3 is a cross sectional view along III-III of FIG. 1 according to the related art.
Figure 4:
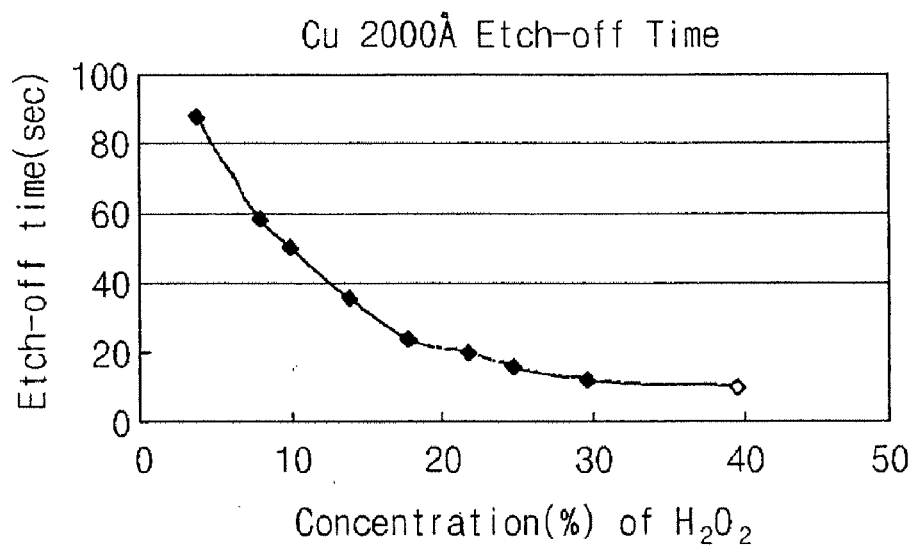
FIG. 4 is a graph showing an exemplary relationship between etch times of a copper layer and concentrations of hydrogen peroxide ($H_2O_2$) according to the present invention.

FIG. 4 is a graph showing an exemplary relationship between etch times of a copper layer and concentrations of hydrogen peroxide ($H_2O_2$) according to the present invention. In FIG. 4, the copper layer used may have a thickness of about 2000 Å. As shown in FIG. 4, as the $H_2O_2$ concentration increases, the etch time of the copper layer decreases. However, the etch time of each of titanium (Ti), tantalum (Ta), and aluminum (Al) doe not vary by the $H_2O_2$ concentration since Ti, Ta, and Al are not effected by the hydrogen peroxide ($H_2O_2$). According to the present invention, the $H_2O_2$ concentration in the etchant may be within a range from about 4% to about 40%.

Figure 5:
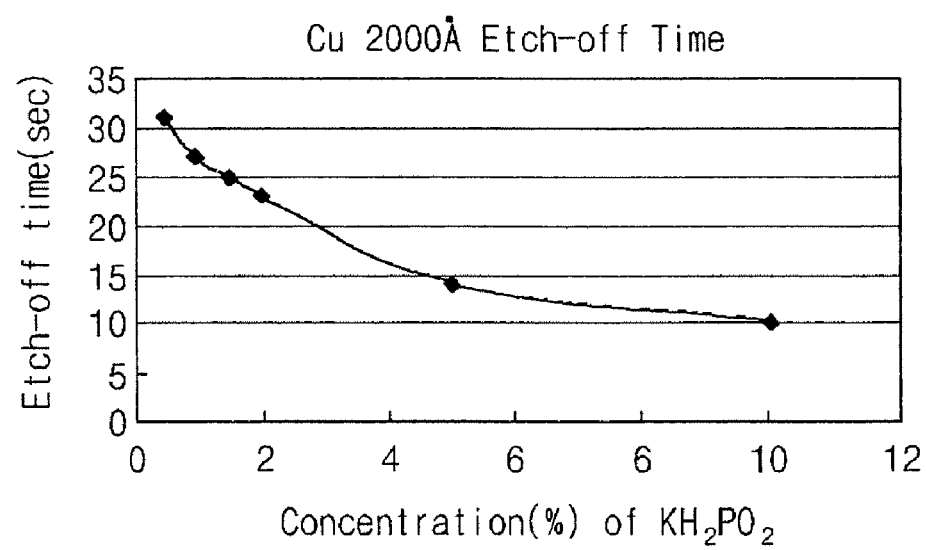
FIG. 5 is a graph showing another exemplary relationship between etch times of a copper layer and concentrations of potassium dihydrogen phosphate ($KH_2PO_4$) according to the present invention.

FIG. 5 is a graph showing another exemplary relationship between etch times of a copper layer and concentrations of potassium dihydrogen phosphate ($KH_2PO_4$) according to the present invention. In FIG. 5, the copper layer may have a thickness of about 2000 Å. As shown in FIG. 5, as the $KH_2PO_4$ concentration increases, the etch time of the copper layer decreases. However, the etch time of each of titanium (Ti), tantalum (Ta), and aluminum (Al) does not vary by the $KH_2PO_4$ concentration since Ti, Ta, and Al are not effected by the potassium dihydrogen phosphate ($KH_2PO_4$). According to the present invention, the $KH_2PO_4$ concentration in the etchant may be within a range from about 0.5% to about 10%.

Figure 6:
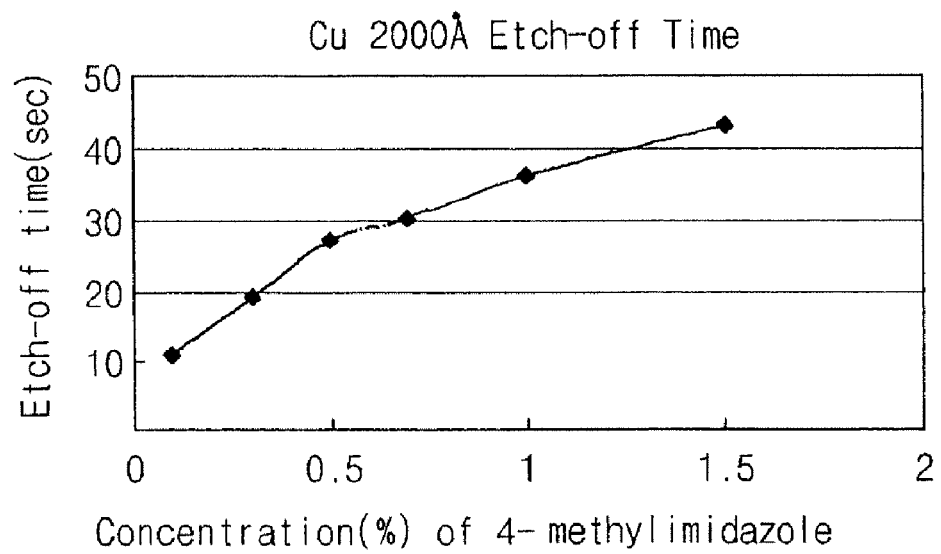
FIG. 6 is a graph showing another exemplary relationship between etch times of a copper layer and concentrations of 4-methylimidazole ($C_4H_6N_2$) according to the present invention.

FIG. 6 is a graph showing another exemplary relationship between etch times of a copper layer and concentrations of 4-methylimidazole ($C_4H_6N_2$) according to the present invention. In FIG. 6, the copper layer may have a thickness of about 2000 Å. As shown in FIG. 6, as the 4-methylimidazole concentration increases, the etch time of the copper layer also increases. According to the present invention, the 4-methylimidazole concentration may be within a range from about 0.2% to about 1.5%. For example, since the Cu etch inhibitor (e.g., 4-methylimidazole ($C_4H_6N_2$)) reacts with the Cu etching compound instead of the copper, it prevents fast copper etching and restrains the increase of a copper etching ratio.

Figure 7:
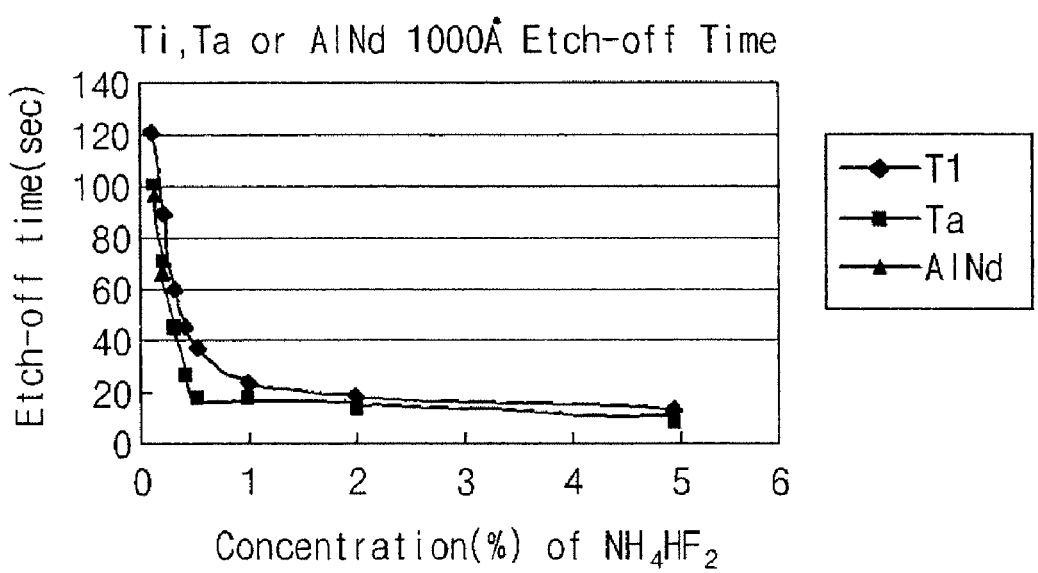
FIG. 7 is a graph showing another exemplary relationship between etch times of metallic layers and concentrations of ammonium bifluoride ($NH_4HF_2$) according to the present invention.

FIG. 7 is a graph showing another exemplary relationship between etch times of metallic layers and concentrations of ammonium bifluoride ($NH_4HF_2$) according to the present invention. In FIG. 7, metallic layers may be titanium (Ti), tantalum (Ta), and aluminum alloys, such as AlNd, and may each have a thickness of about 1000 Å. As shown in FIG. 7, as the F-ion concentration increases, the etch time of the metallic layers decreases. Although not shown, the etch time of the copper layer also decreases, as the F-ion concentration increases. According to the present invention, the F-ion concentration may be within a range from about 0.01% to about 5%.

Figure 8:
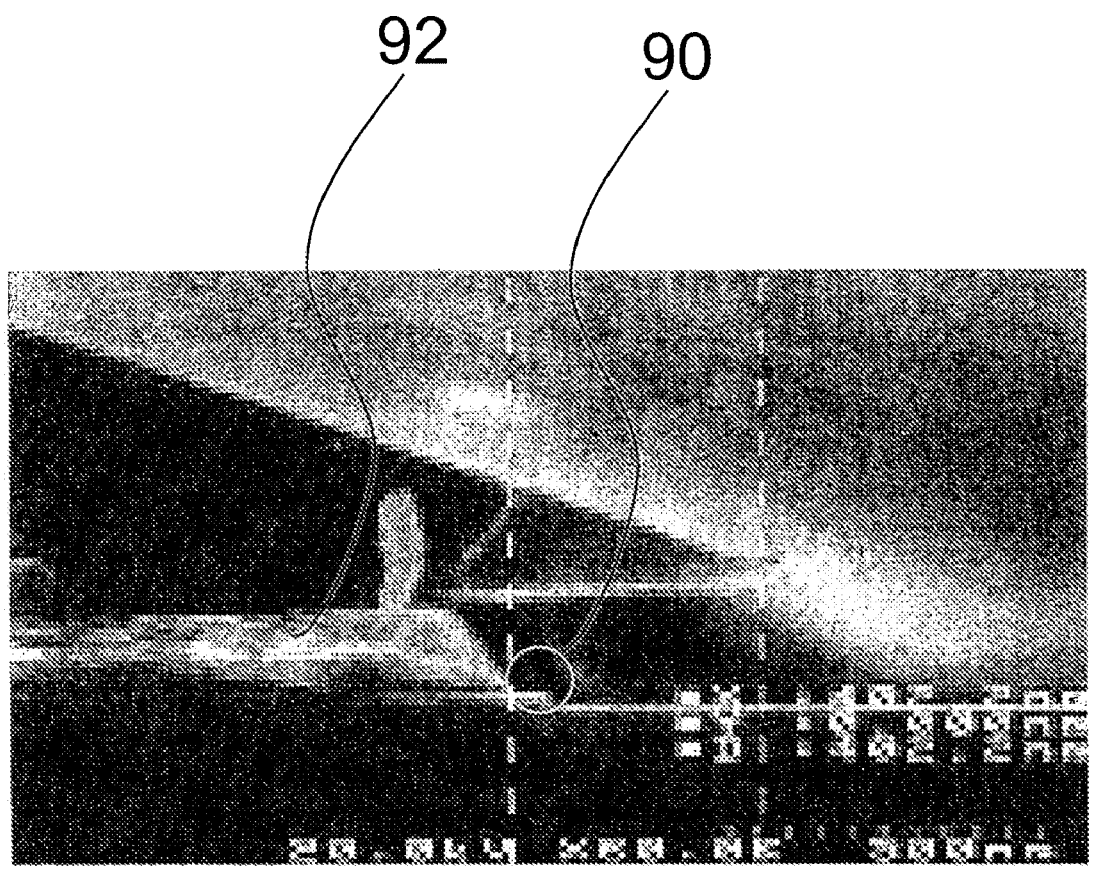
FIG. 8 is a photomicrograph showing an exemplary interfacial condition between a partially-etched copper/aluminum alloy (Cu/Al-alloy) double layer and an overlaying insulator according to the present invention.
Figure 9:
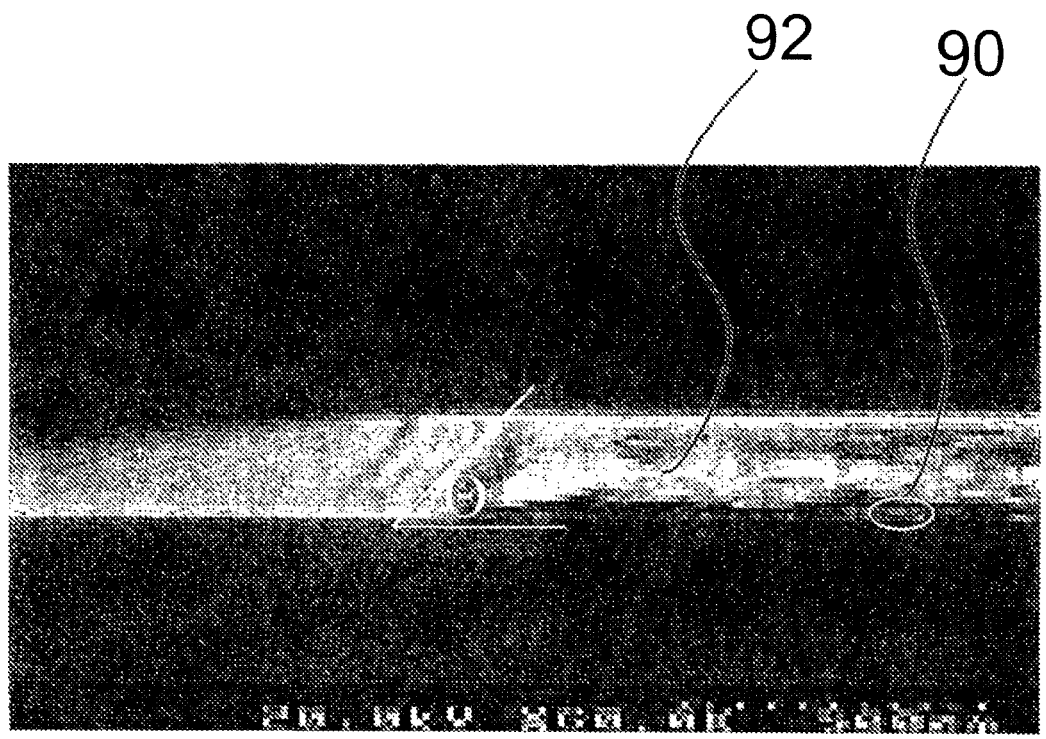
FIG. 9 is a photomicrograph showing an exemplary slope of a partially-etched copper/aluminum alloy (Cu/Al-alloy) double layer according to the present invention.
Figure 10:
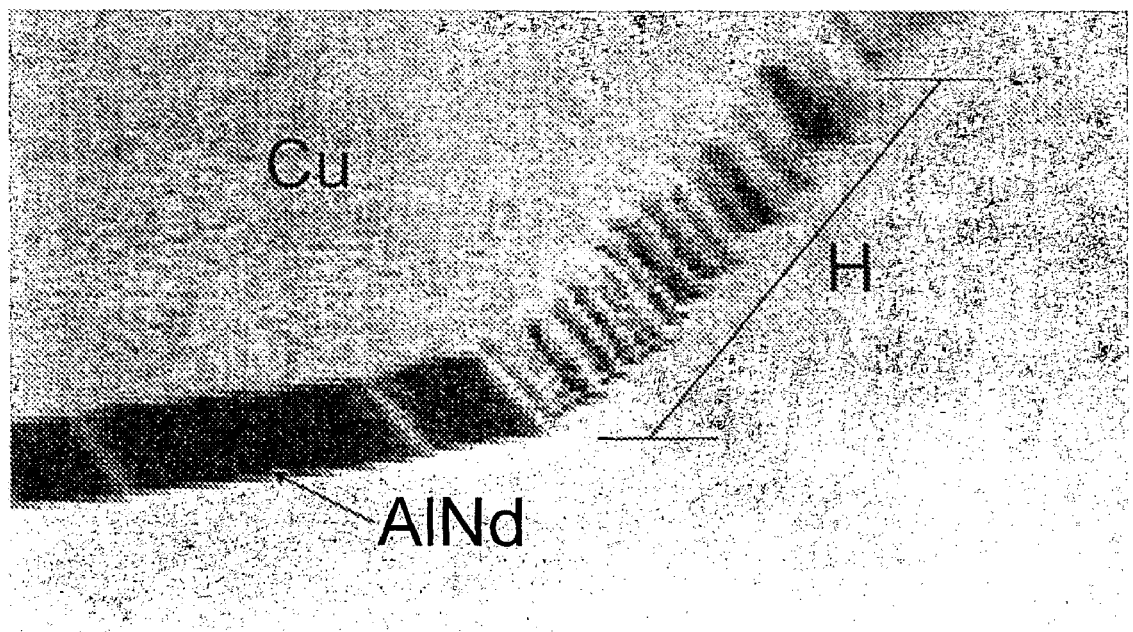
FIG. 10 is a photomicrograph of an exemplary partially-etched copper/aluminum alloy (Cu/Al-alloy) double layers according to the present invention.

According to the present invention, when etching Cu-aluminum alloy (Cu—AlNd) double layer structures using the etchant compounds described above, the etched double layer structures may be obtained, as shown in FIGS. 8-10. For example, the Cu layer may have a thickness of about 2000 Å, and the AlNd layer may have a thickness of about 200 Å.

FIG. 8 is a photomicrograph showing an exemplary interfacial condition between a partially-etched copper/aluminum alloy (Cu/Al-alloy) double layer and an overlaying insulator according to the present invention. In FIG. 8, a double-layered metal layer structure may include a Cu layer 92 and an Al-alloy layer 90, such as AlNd, and may be partially etched using the etchant according to the present invention described above. In addition, an insulator 94 may be formed on the double-layered metal layer structure. According to the present invention, and as shown in FIG. 8, delamination does not occur between the overlying insulator 94 and the underlying double-layered metal layer structure. Thus, deposition defects may be prevented.

FIG. 9 is a photomicrograph showing an exemplary slope of a partially-etched copper/aluminum alloy (Cu/Al-alloy) double layer according to the present invention. In FIG. 9, an AlNd layer 90 and a Cu layer 92 may be sequentially formed as an AlNd—Cu double layer structure. Then, the AlNd—Cu double layer structure may be simultaneously etched using the etchant according to the present invention, as described above. As a result, the AlNd—Cu double layer structure may have a relatively gentle slope Θ without having an overhang structure in which the underlying AlNd layer 90 is over-etched below the overlying Cu layer 92.

FIG. 10 is a photomicrograph of an exemplary partially-etched copper/aluminum alloy (Cu/Al-alloy) double layers according to the present invention. The double-layered metal pattern structure of Cu/Al-alloy may have a relatively gentle slope along its patterned sides. Furthermore, when the double-layered metal layer structure of Cu/Al-alloy is patterned using the etchant according to the present invention, the patterned side of the double-layered metal layer structure of Cu/Al-alloy may have a relatively straight line shape H. As a result, the etchant according to the present invention has an increased etching ability, and the patterned double layer structures may have improved patterned shapes.

Moreover, the etchant according to the present invention may not only etch the Cu—Al-alloy double layer structures, but may also etch the Cu—Al, Cu—Ti, and Cu—Ta double layer structures. In addition, the etchant according to the present invention may have an improved ability to etch the Cu—Ti alloy and Cu—Ta alloy double layer structures.

Figure 11A:
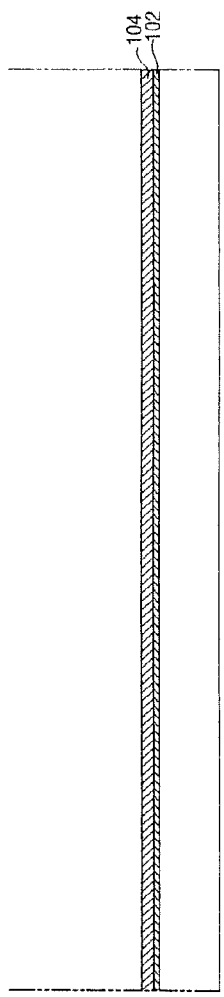

FIGS. 11A to 11EC are cross sectional views of an exemplary method of fabricating of an array substrate according to the present invention. In FIG. 11A, aluminum (Al) or an Al-alloy may be formed on a substrate 100. Then, copper (Cu) may be subsequently formed over the substrate 100, thereby forming a first metal layer 102 of aluminum or an aluminum alloy and a second metal layer 104 of copper. Next, the double metal layer structure of Al/Cu or Al-alloy/Cu may be patterned using the etchant according to the present invention, as described above. Accordingly, the etchant may include hydrogen peroxide ($H_2O_2$), a phosphoric acid (or phosphate), F-ions, an organic acid having a carboxyl group (—COOH), a copper (Cu) inhibitor, a $H_2O_2$ stabilizer, and an additive to improve the etching properties. An exemplary amount of the hydrogen peroxide ($H_2O_2$) may be within a range from about 4% to about 40%, an exemplary amount of the phosphate may be within a range from about 0.5% to about 10%, and an exemplary amount of the organic acid may be within a range from about 0.5% to about 10%. Furthermore, an exemplary amount of the Cu etch inhibitor may be within a range from about 0.2% to about 1.5%, an exemplary amount of the $H_2O_2$ stabilizer may have about a 1% concentration, and an exemplary amount of the additive may have about a 1% concentration.

Figure 11B:
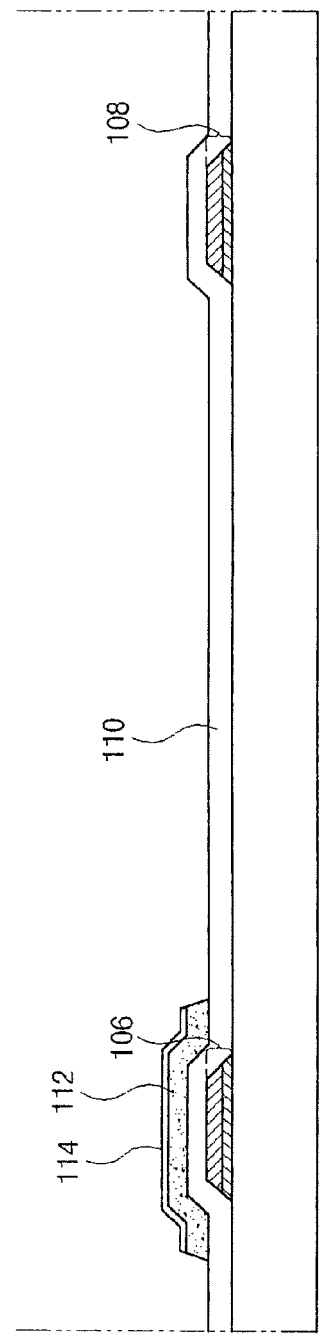

In FIG. 11B, after etching the Al/Cu or Al-alloy/Cu double layer structure, a double-layered gate line 108 and a double-layered gate electrode 106 may be formed on the substrate 100. For example, the gate line 108 may be disposed horizontally on the substrate 100, and the gate electrode 106 may be elongated from the gate line 108. Furthermore, a gate insulating layer 110 may be formed on the substrate 100 to cover the double-layered gate electrode 106 and the gate line 108, wherein the gate insulating layer 110 may be formed of silicon nitride ($SiN_x$) or silicon oxide ($SiO_2$). Next, pure amorphous silicon (a-Si:H) and doped amorphous silicon (n+a-Si:H) may be subsequently deposited on the gate insulating layer 110, and patterned to form an active layer 112 on the gate insulating layer 110 and an ohmic contact layer 114 on the active layer 112. For example, the active layer 112 and the ohmic contact layer 114 may be disposed over the double-layered gate electrode 116.

In FIG. 11C, a third metal layer 116 and a fourth metal layer 118 may be formed on the gate insulating layer 110 to cover the active layer 112 and the ohmic contact layer 114. The third metal layer 116 may be formed of one of titanium (Ti), Ti-alloy, tantalum (Ta), and Ta-alloy, and the fourth metal layer 118 may be formed of copper (Cu). Alternatively, the third metal layer 116 may be aluminum (Al) or an Al-alloy instead of Ta or Ti. However, when Al or an Al-alloy is used to form the third metal layer 116, a buffer layer may be required between the ohmic contact layer 114 and the third metal layer 116 to be formed of Al or an Al-alloy since the aluminum atoms may penetrate into the underlying ohmic contact layer 114 and ohmic contact layer 112.

In FIG. 11D, the third and fourth metal layers 116 and 118 may be simultaneously patterned using the etchant according to the present invention, as described above, thereby forming a double-layered source electrode 116, a double-layered drain electrode 118, and a double-layered data line 120. The source and drain electrodes 116 and 118 may contact the ohmic contact layer 114, and the data line 120 may be disposed longitudinally perpendicular to the double-layered gate line 108. Then, a passivation layer 124 may be formed over an entire surface of the substrate 110 to cover the double-layered source and drain electrodes 116 and 118 and the double-layered data line 120. The passivation layer 124 may be an inorganic material, such as silicon nitride (SiNX) or silicon oxide (SiO2), or may be an organic material, such as benzocyclobutene (BCB) or an acrylic resin. Next, the passivation layer 124 may be patterned to form a drain contact hole 126 that exposes a portion of the double-layered drain electrode 118.

In FIG. 11E, a transparent conductive material may be deposited on the passivation layer 124, and patterned to form a pixel electrode 128. The transparent conductive material may be indium tin oxide (ITO) or indium zinc oxide (IZO), and the pixel electrode 128 may contact the double-layered drain electrode 118 through the drain contact hole 126. Accordingly, the array substrate having the double-layered metal pattern structure formed of Cu and other metals may be completed.

According to the present invention, the double layers including Cu/Al, Cu/Al-alloy, Cu/Ti, Cu/Ti-alloy, Cu/Ta, or Cu/Ta-alloy may be used for gate and data lines and for electrodes of the TFT since the etchant according to the present invention may simultaneously etch the double layer structures. Furthermore, the etchant may provide superior pattern profiles, thereby forming gentle slopes and uniform etching characteristics. Since the etchant according to the present invention may simultaneously pattern the double-layered copper structures, fabrication processes may be reduced and fabrication yield may be increased. Accordingly, the array substrate including the double-layered copper lines and electrodes may be used for large-sized LCD panels since copper has relatively low electrical resistance.

It will be apparent to those skilled in the art that various modifications and variations can be made in the etchant for etching a double-layered copper structure and method of forming an array substrate having double-layered copper structures of the present invention without departing from the spirit or scope of the invention. Thus, it is intended that the present invention cover the modifications and variations of this invention provided they come within the scope of the appended claims and their equivalents.

What is claimed is:

1. A method of forming an array substrate of a liquid crystal display device, comprising:

forming a first metallic layer on a substrate;

forming a first copper (Cu) layer on the first metallic layer;

patterning the first metallic layer and the first Cu layer simultaneously using a first etchant to form a gate line and a gate electrode, the first etchant includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer;

forming a gate insulating layer over an entire surface of the substrate to cover the gate line and the gate electrode;

forming an active layer and an ohmic contact layer on the gate insulating layer and over the gate electrode;

forming a second metallic layer and a second copper (Cu) layer over the gate insulating layer to cover the active layer and the ohmic contact layer;

patterning the second metallic layer and the second Cu layer simultaneously using a second etchant to form a source electrode, a drain electrode, and a data line, the second etchant includes hydrogen peroxide ($H_2O_2$), a phosphate, F-ions, an organic acid having a carboxyl group (—COOH), a copper (Cu) inhibitor, and a hydrogen peroxide ($H_2O_2$) stabilizer;

forming a passivation layer over the gate insulating layer to cover the source and drain electrodes and the data line, the passivation layer having a drain contact hole exposing a portion of the data line; and forming a pixel electrode on the passivation layer, the pixel electrode contacting the drain electrode through the drain contact hole.

2. The method according to claim 1, wherein the gate insulating layer is an inorganic material including one of a group consisting of silicon nitride and silicon oxide, and the pixel electrode is formed of a transparent conductive material including one of a group consisting of indium tin oxide and indium zinc oxide.

3. The method according to claim 1, wherein the first metallic layer is one of aluminum (Al) and an aluminum alloy (Al-alloy).

4. The method according to claim 1, wherein the second metallic layer is one of titanium (Ti), tantalum (Ta), titanium alloy (Ti-alloy), and a tantalum alloy (Ta-alloy).

5. The method according to claim 1, wherein a concentration of the hydrogen peroxide ($H_2O_2$) is within a range from about 4% to about 40%, a concentration of the phosphoric acid is within a range from about 0.5% to about 10%, a concentration of the F-ions is within a range from about 0.01% to about 5%, a concentration of the organic acid is within a range from about 0.5% to about 10%, a concentration of the Cu etch inhibitor is within a range from about 0.2% to about 1.5%, and a concentration of the $H_2O_2$ stabilizer is about 1%.

6. The method according to claim 1, wherein the phosphate has a chemical formula of $A_xH_yPO_4$, wherein "A" is one of an alkali metal and an alkaline earth metal, "X" has a value within a range of about 1 to about 2, and "Y" has a value within a range of about 0 to about 2.

7. The method according to claim 6, wherein the alkali metal is one of potassium (K) and sodium (Na), and the alkaline earth metal is one of calcium (Ca) and barium (Ba).

8. The method according to claim 6, wherein the phosphate includes one of ammonium ($NH_4$) and ammonium derivatives.

9. The method according to claim 1, wherein the organic acid is one of acetic acid ($CH_3COOH$), formic acid (HCOOH), oxalic acid (($COOH)_2$), citric acid ($C_6H_8O_7$), and glycolic acid ($HOCH_2COOH$).

10. The method according to claim 1, wherein the Cu etch inhibitor is an azole compound including one of a group consisting of methylimidazole ($C_4H_6N_2$) and pyrazole ($NHNH_2$).

11. The method according to claim 1, wherein the Cu etch inhibitor is a triazole compound including one of a group consisting of tolytriazole ($CH_3N_3$) and benzotriazole ($C_6H_5N_3$).

12. The method according to claim 1, further comprising an additive having about a 1% concentration, wherein the additives are salicylic acid derivatives.

13. The method according to claim 1, wherein the $H_2O_2$ stabilizer is acetate including one of a group consisting of ammonium acetate ($CH_3COONH_4$), potassium acetate ($CH_3COOK$), and sodium acetate ($CH_3COONa$).

14. The method according to claim 1, wherein the F-ion is a fluoride including one of a group consisting of hydrofluoric acid (HF), ammonium fluoride ($NH_4F$), potassium fluoride (KF), sodium fluoride (NaF), and ammonium hydrogen fluoride ($NH_4HF$).

15. The method according to claim 1, wherein the second metal layer is one of aluminum (Al) layer and an aluminum alloy layer.

16. The method according to claim 1, wherein one of the gate line, the gate electrode, the source electrode, the drain electrode and the data line has substantially gentle slope along the patterned side.

* * * * *